(12) United States Patent
Naeimi

(10) Patent No.: US 9,978,432 B2
(45) Date of Patent: May 22, 2018

(54) WRITE OPERATIONS IN SPIN TRANSFER TORQUE MEMORY

(71) Applicant: Intel Corporation, Santa Clara, CA (US)

(72) Inventor: Helia Naeimi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/580,141

(22) Filed: Dec. 22, 2014

(65) Prior Publication Data

US 2016/0180909 A1   Jun. 23, 2016

(51) Int. Cl.
*G11C 11/16* (2006.01)
*G11C 7/04* (2006.01)

(52) U.S. Cl.
CPC ............ *G11C 11/1675* (2013.01); *G11C 7/04* (2013.01); *G11C 11/1659* (2013.01)

(58) Field of Classification Search
CPC . G11C 11/16; G11C 11/1675; G11C 11/1653; G11C 11/1673
USPC .......................................................... 365/158
See application file for complete search history.

(56) References Cited

U.S. PATENT DOCUMENTS

| 2003/0046020 | A1 | 3/2003 | Scheuerlein |
| 2005/0180239 | A1 | 8/2005 | Tsang |
| 2011/0063903 | A1 | 3/2011 | Kang et al. |
| 2012/0181651 | A1 | 7/2012 | Jiang |
| 2012/0221781 | A1 | 8/2012 | Frost et al. |
| 2013/0159607 | A1* | 6/2013 | Kyung ............... G11C 16/10 711/103 |
| 2014/0016397 | A1* | 1/2014 | Lee ............... G11C 13/0069 365/148 |
| 2014/0098600 | A1* | 4/2014 | Kim ............... G11C 11/1695 365/158 |
| 2015/0213845 | A1* | 7/2015 | Choi ............... G11C 5/147 365/189.06 |

* cited by examiner

*Primary Examiner* — Alexander Sofocleous
*Assistant Examiner* — Alfredo Bermudez Lozada
(74) *Attorney, Agent, or Firm* — Thorpe North & Western, LLP

(57) ABSTRACT

Apparatus, systems, and methods for write operations in spin transfer torque (STT) memory are described. In one embodiment, a memory comprises at least one spin-transfer torque (STT) memory device, temperature sensor proximate the STT memory device and a controller comprising logic, at least partially including hardware logic, to monitor an output of the temperature sensor, implement a first write operation protocol when the output of the temperature sensor fails to exceed a threshold temperature, and implement a second write operation protocol when the output of the temperature sensor exceeds the threshold temperature. Other embodiments are also disclosed and claimed.

12 Claims, 8 Drawing Sheets

WRITE OPERATIONS IN SPIN TRANSFER TORQUE MEMORY

TECHNICAL FIELD

The present disclosure generally relates to the field of electronics. More particularly, some embodiments of the invention generally relate to write operations in spin-transfer torque memory.

BACKGROUND

Many electronic devices include memory systems that may be implemented using local, fast-access memory which is frequently embodied as a nonvolatile memory. Spin transfer torque (STT) memory is developing as a technology for nonvolatile memory systems. Accordingly, techniques to manage write operations in STT memory systems may find utility, e.g., in memory systems for electronic devices.

BRIEF DESCRIPTION OF THE DRAWINGS

The detailed description is provided with reference to the accompanying figures. The use of the same reference numbers in different figures indicates similar or identical items.

DESCRIPTION OF EMBODIMENTS

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Spin transfer torque (STT) memory technology, which stores data by the spin orientation of a soft ferromagnetic material and shows current induced switching, is an attractive new memory technology because it is CMOS logic compatible, scalable, and has high density. Furthermore, it is non-volatile and has competitive read latency. STT Random Access Memory (RAM) is a type of resistive-RAM which utilizes two layers of magnetic materials, with one fixed layer and one free layer. Spin-polarized current is passed through the device to create either parallel (P), or anti-parallel (AP) polarizations in the magnetic layers, thus storing the information.

Operating characteristics of STT memory change in response to changes in temperature. More particularly, at low temperatures STT memory requires relatively high levels of current applied in relatively long pulses to implement a write operation. The level of current and time required to implement a write operation in STT memory decreases as the temperature of the memory increases. Further, STT memory cells are prone to an unwanted flip (i.e., to change its logical state) during read operations at high temperatures.

In some examples described herein the subject matter described herein addresses these and other issues by implementing a first write operation protocol when a temperature of the STT memory fails to exceed a temperature threshold and a second write operation protocol when the temperature of the STT memory exceeds the temperature threshold. The first write operation protocol implements write operations only in memory cells that are being modified by the write operation in order to save time and energy. The second write operation protocol implements write operations without regard to whether the memory cell is being modified.

Further details are described with reference to FIGS. 1-10, below.

Figure 1:
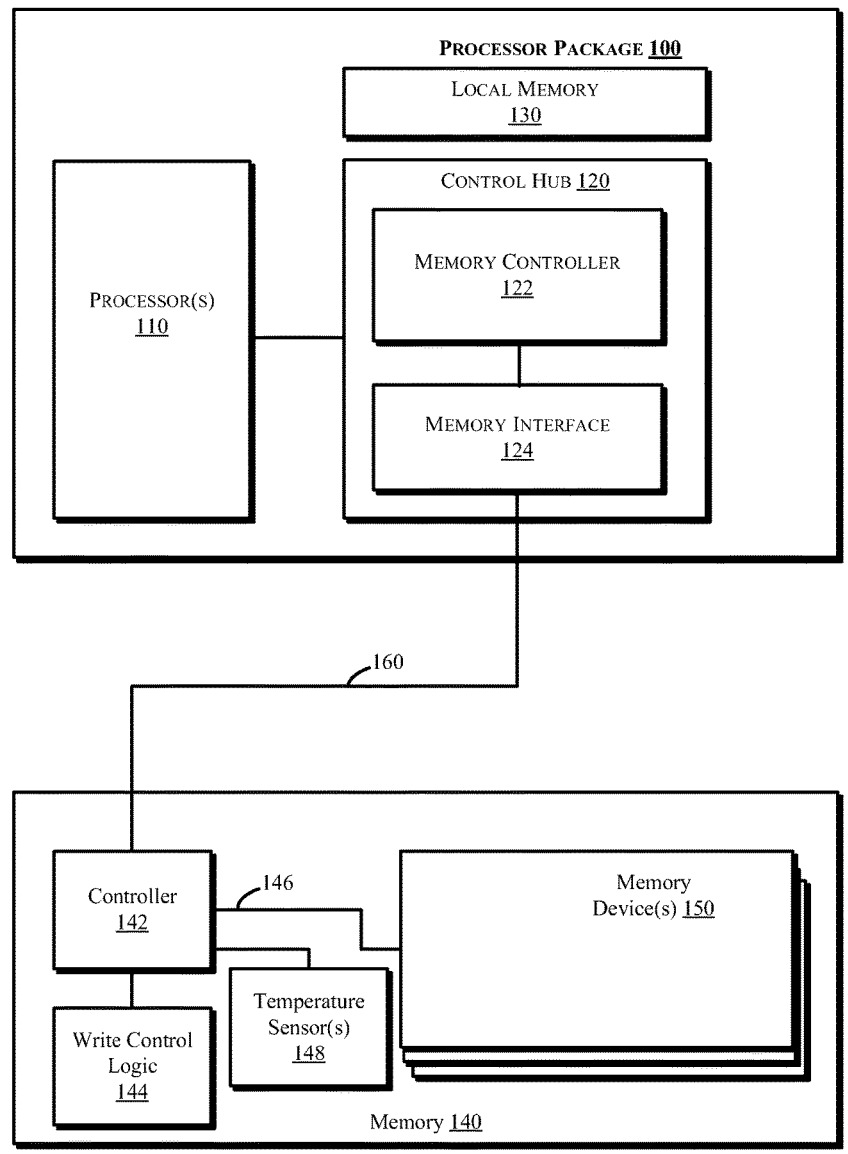
FIG. 1 is a schematic, block diagram illustration of components of apparatus to implement write operations in spin transfer torque (STT) memory in accordance with various examples discussed herein.

FIG. 1 is a schematic, block diagram illustration of components of apparatus to implement write operations in spin transfer torque (STT) memory in accordance with various examples discussed herein. Referring to FIG. 1, in some embodiments a central processor package 100 which may comprise one or more processors 110 coupled to a control hub 120 and a local memory 130. Control hub 120 comprises a memory controller 122 and a memory interface 124.

Memory interface 124 is coupled to a memory 140 by a communication bus 160. In some examples, the communication bus 160 may be implemented as traces on a printed circuit board, a cable with copper wires, a fibre optic cable, a connecting socket, or a combination of the above.

Memory 140 may comprise a controller 142, write control logic 144, and one or more memory device(s) 150. In various embodiments, at least some of the memory devices 150 may be implemented using nonvolatile memory, e.g., spin-transfer torque (STT) memory. As described above, in some embodiments write control logic 144, which may be coupled to controller 142 or integrated into controller 142 implements write operations in spin transfer torque (STT) memory 140. Further, memory 140 may comprise one or more temperature sensors 148 coupled to controller 142. In some examples temperature sensor(s) 148 may be implemented as thermistors, thermocouples, or the like.

Figure 2:
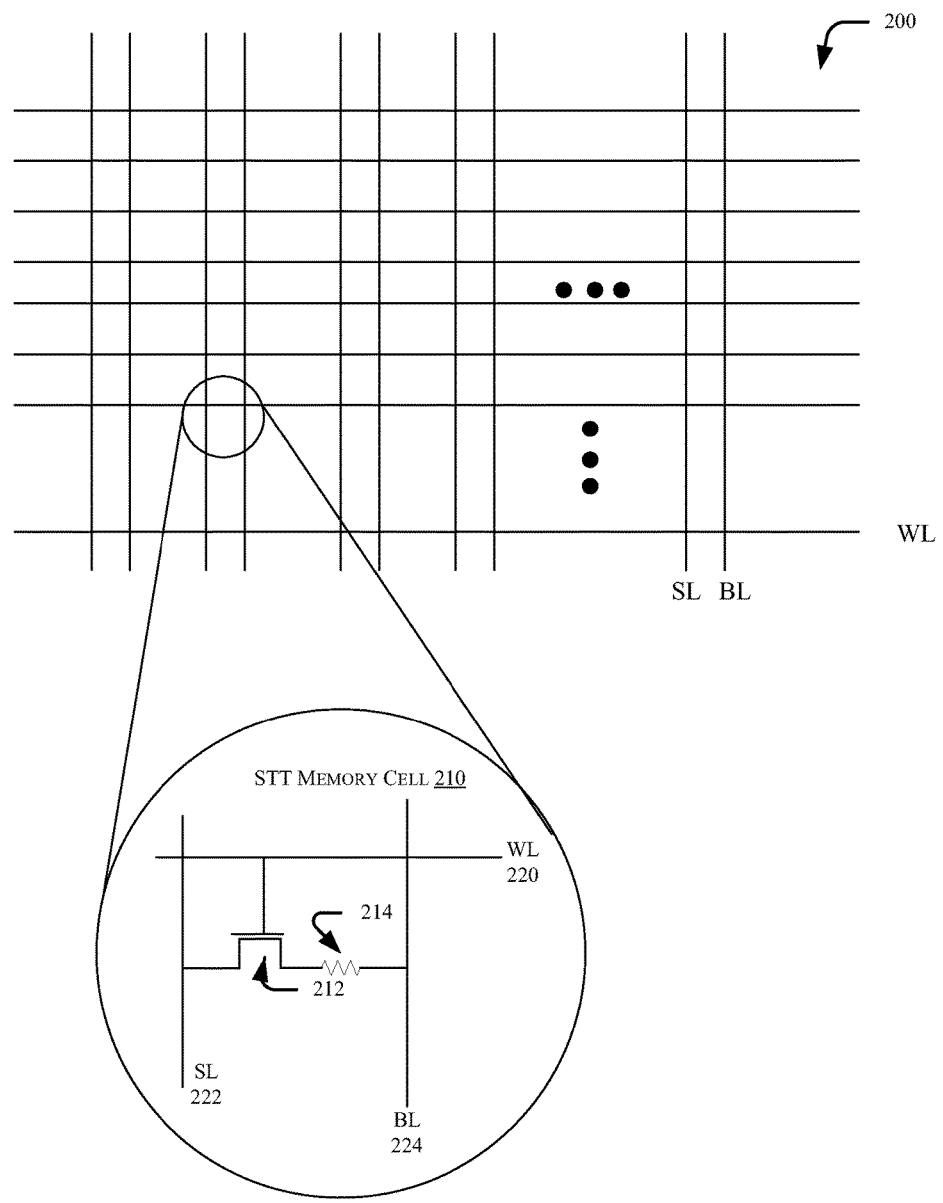
FIG. 2 is a schematic block diagram of an architecture of a spin transfer torque (STT) memory in accordance with various examples discussed herein.

FIG. 2 is a schematic block diagram of an architecture of a spin transfer torque (STT) memory 200 in accordance with various examples discussed herein. Referring to FIG. 2, in some examples memory 200 comprises a plurality of rows identified as row 1, row 2, row 3, row 4, and so on up to row M. Each row includes a plurality of memory cells identified as cell 1, cell 2, cell 3, and so on up to cell N. Thus, memory 200 is structured as an M×N memory matrix.

A representative spin transfer torque memory cell 210 is depicted in FIG. 2. Memory cell 210 comprises a transistor 212 and a magnetic tunnel junction 214, a word line (WL) 220, a select line (SL) 222, and a bit line (BL) 224. In operation, the cell 210 is read by precharging BL 224 to a read voltage, $V_{RD}$ and allowing the voltage to decay through the cell 210 when a voltage is applied to WL 220. A reference bit line, which is drained contemporaneously using a reference cell, acts as the sense amplifier reference. Both the reference and the accessed bit lines are clamped using a P-type metal-oxide-semiconductor (PMOS) current source so that a constant voltage differential is maintained at the sense amplifier input, even for very long access times.

Having described components and an architecture to implement write operations in spin transfer torque (STT) memory, operations to implement write operations in spin transfer torque (STT) memory will now be described with reference to FIGS. 3-5. In some examples the operations depicted in FIGS. 3-5 may be implemented by the write control logic 144, alone or in combination with controller 142.

Figure 3:
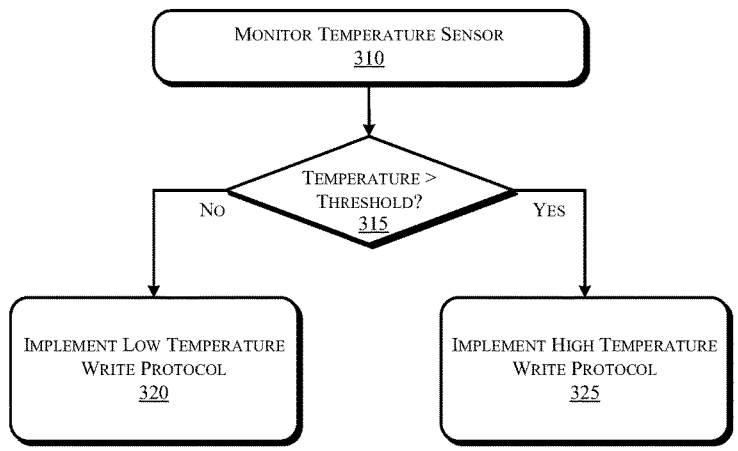
FIGS. 3, 4 and 5 are flowcharts illustrating operations in a method to implement write operations in spin transfer torque (STT) memory in accordance with various embodiments discussed herein.

Referring first to FIG. 3, at operation 310 the controller 140 monitors an output of the temperature sensor(s) 148. If, at operation 315 an output of the temperature sensor(s) 148 indicates that the temperature proximate the memory 140 does not exceed a threshold then control passes to operation 320 and the controller 142 implements a low-temperature write protocol. By contrast, if at operation 315 output of the temperature sensor(s) 148 indicates that the temperature proximate the memory 140 exceeds a threshold then control passes to operation 325 and the controller 142 implements a high-temperature write protocol.

Figures 4, 5:
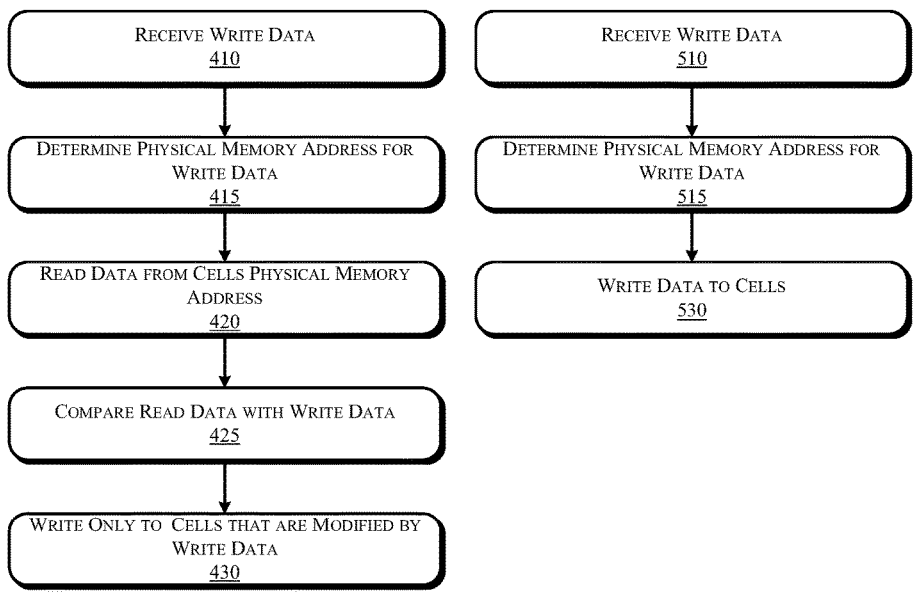

FIG. 4 is a flowchart illustrating operations implemented by controller 142 to implement a low-temperature write protocol, according to examples. Referring briefly to FIG. 4, at operation 410 the controller 142 receives write data from a host device, e.g., from one or more of the processor(s) 110 on processor package 100 via memory controller 122 and memory interface 124. At operation 415 the controller 142 determines a physical memory address for the write data received from the host device. For example, the physical memory address may identify one or more cells in the memory depicted in FIG. 2 for the write data.

At operation 420 the controller reads the data from the cell(s) associated with the physical memory address determined in operation 415, and at operation 425 the controller 142 compares the data with the write data. By way of example, in some cases the controller 142 performs a bitwise XOR of the read data from memory cells in the physical address with the write data received from the host device to determine if the memory cells are to be modified by the write operation.

Finally, at operation 430 the controller 142 writes the write data received from the host device only to the memory cells that are identified in operation 425 as being modified by the write data. For example, if the read operation at operation 420 indicates that a memory cell contains a logic 0 and the write data received from the host device will write a logic 0 into the cell, then the controller 142 does not execute a write operation on that cell. Similarly, if the read operation at operation 420 indicates that a memory cell contains a logic 1 and the write data received from the host device will write a logic 1 into the cell, then the controller 142 does not execute a write operation on that cell. By contrast, if the if the read operation at operation 420 indicates that a memory cell contains a logic 0 and the write data received from the host device will write a logic 1 into the cell, then the controller 142 executes a write operation on that cell. Similarly if the read operation at operation 420 indicates that a memory cell contains a logic 1 and the write data received from the host device will write a logic 0 into the cell, then the controller 142 executes a write operation on that cell.

FIG. 5 is a flowchart illustrating operations implemented by controller 142 to implement a high-temperature write protocol. Referring to FIG. 5, at operation 510 the controller 142 receives write data from a host device, e.g., from one or more of the processor(s) 110 on processor package 100 via memory controller 122 and memory interface 124. At operation 515 the controller 142 determines a physical memory address for the write data received from the host device. For example, the physical memory address may identify one or more cells in the memory depicted in FIG. 2 for the write data.

At operation 530 the controller 142 writes the write data received from the host device to the memory cells of the physical memory address. In some examples the controller 142 may apply up to an order of magnitude shorter pulse for a few degrees increase in temperature. The controller 142 may also apply a smaller current as the temperature rises, however the effect is more linear.

Thus, the operations depicted in FIGS. 3-5 enable the controller 142 to implement distinct write operation protocols in spin transfer torque (STT) memory at different temperature settings. More particularly, a low-temperature write protocol writes selectively only to cells that are to be modified by write data. By contrast, a high-temperature protocol writes to all cells, but at a lower current level and for a shorter write pulse.

Figure 6:
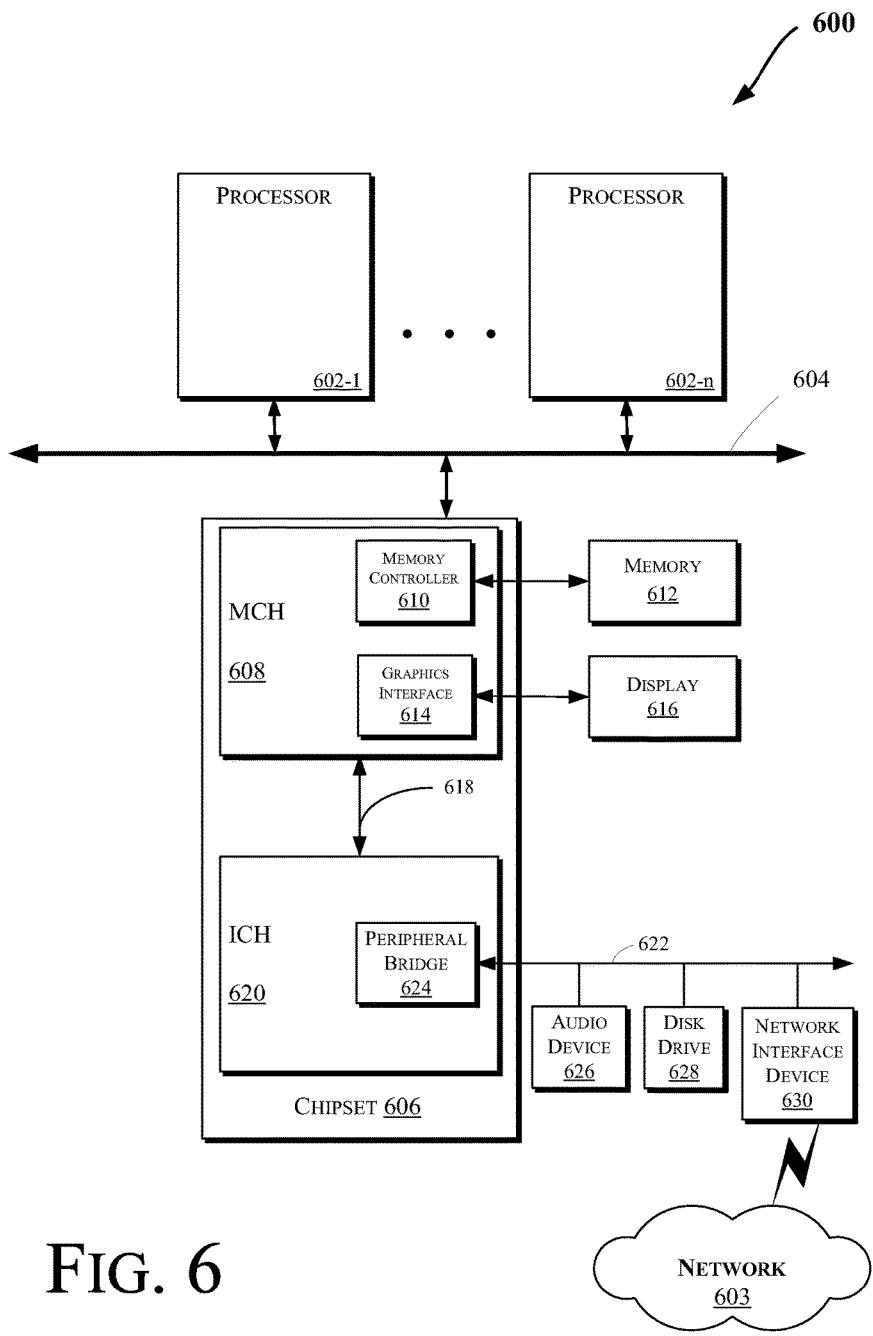
FIGS. 6-10 are schematic, block diagram illustrations of electronic devices which may be adapted to implement write operations in spin transfer torque (STT) memory in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (processors) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1.

A chipset 606 may also communicate with the interconnection network 604. The chipset 606 may include a memory control hub (MCH) 608. The MCH 608 may include a memory controller 610 that communicates with a memory 612. The memory 412 may store data, including sequences of instructions, that may be executed by the processor 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processors and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
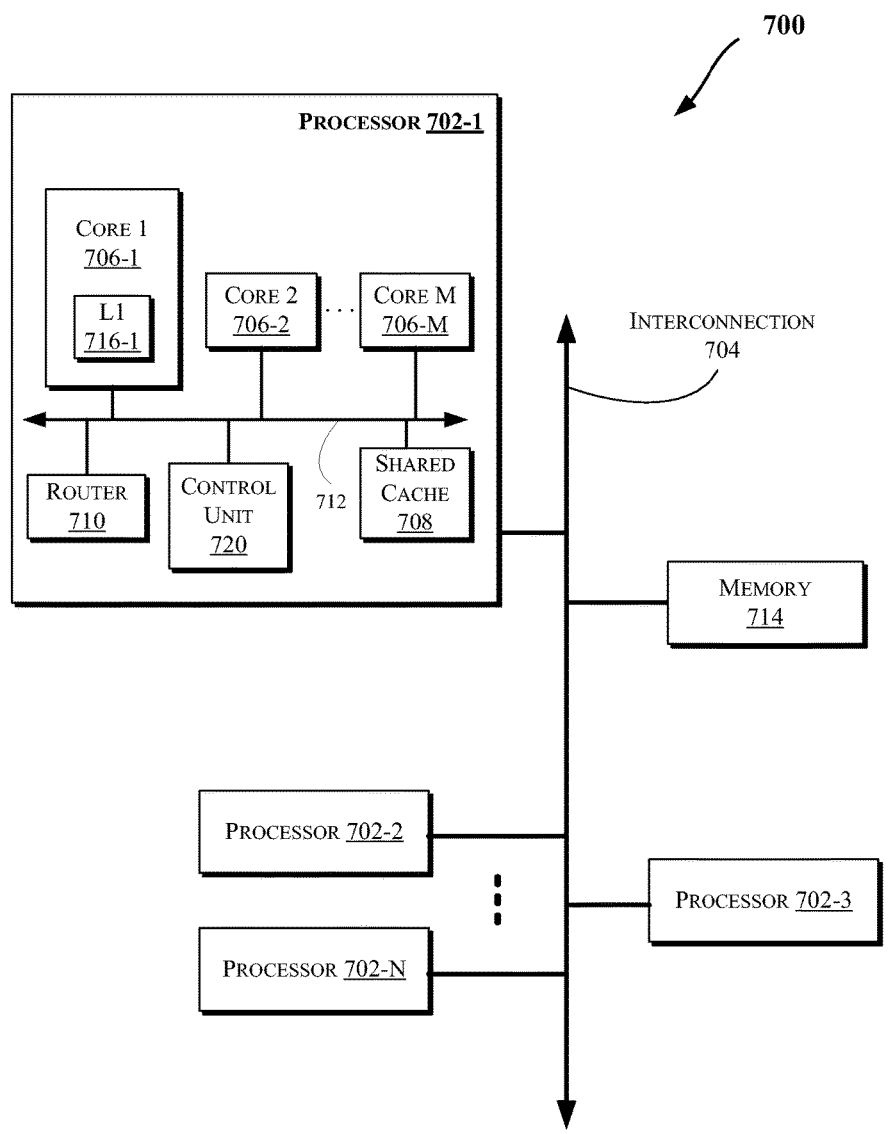

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716").

Figure 8:
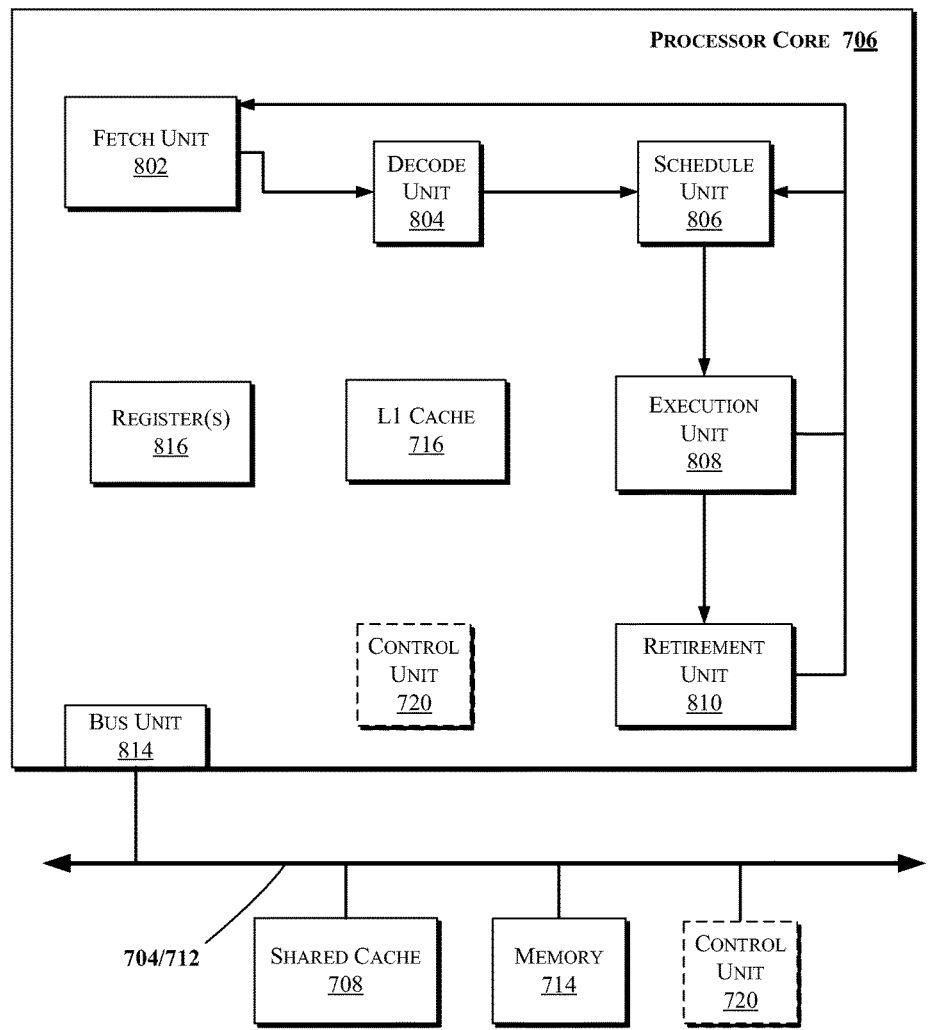

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
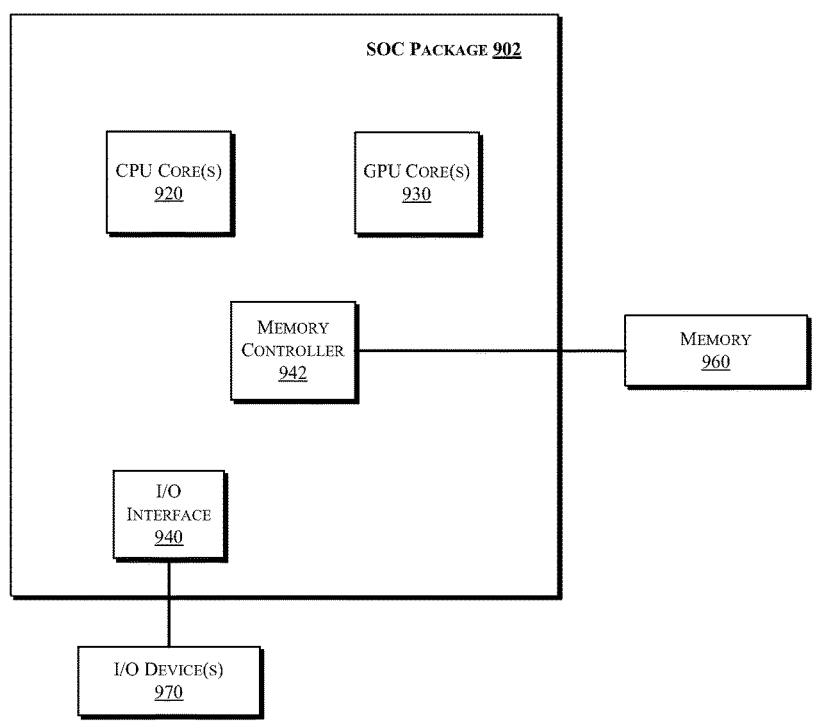

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more processor cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
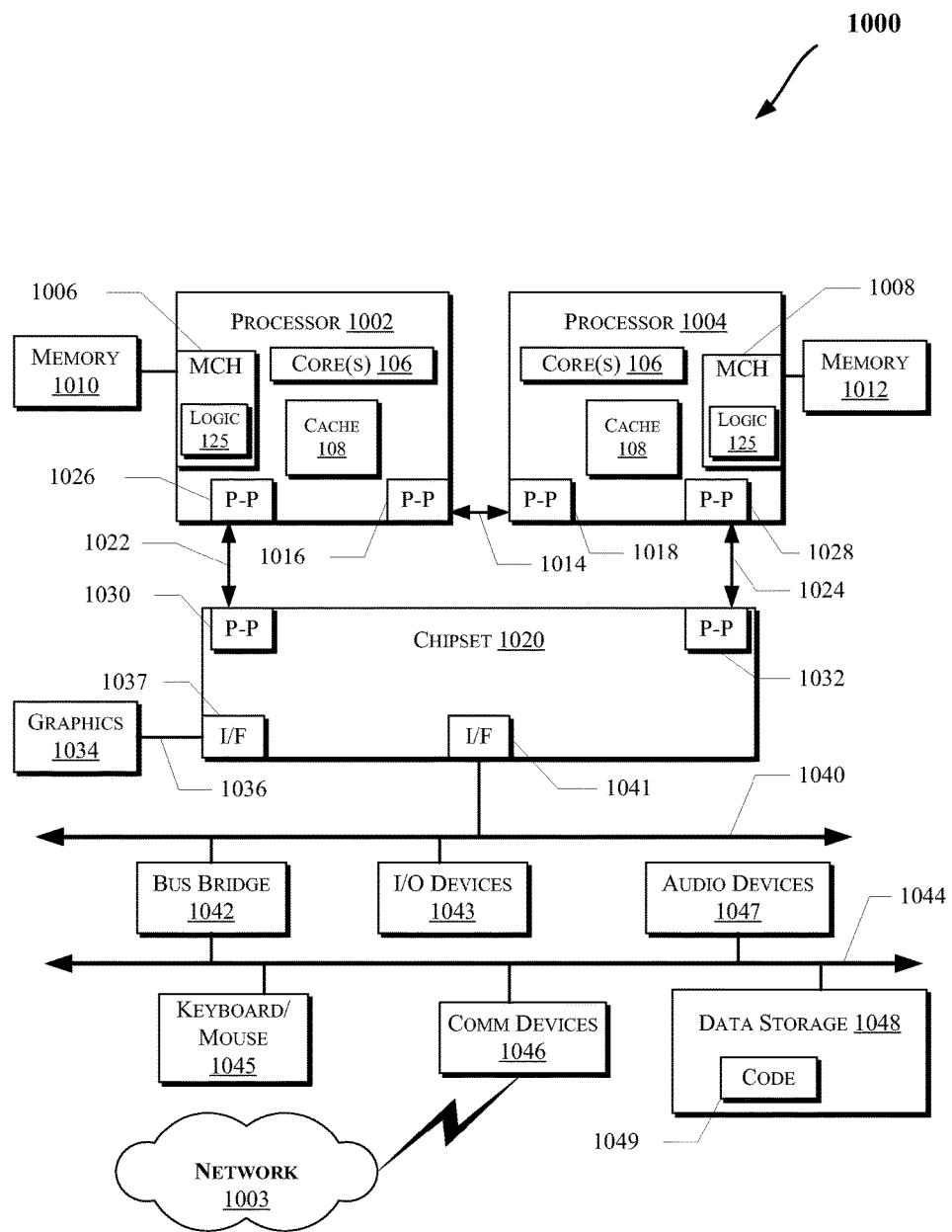

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1002 and 1004. Other embodiments of the invention, however, may exist in other circuits, logic units, or devices within the system 1000 of FIG. 10. Furthermore, other embodiments of the invention may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 803), audio I/O device, and/or a data storage device 1048. The data storage device 1048 (which may be a hard disk drive or a NAND flash based solid state drive) may store code 1049 that may be executed by the processors 1002 and/or 1004.

The following examples pertain to further embodiments.

Example 1 is a memory comprising at least one spin-transfer torque (STT) memory device a temperature sensor proximate the STT memory device; and a controller comprising logic, at least partially including hardware logic, to monitor an output of the temperature sensor, implement a first write operation protocol when the output of the temperature sensor fails to exceed a threshold temperature and implement a second write operation protocol when the output of the temperature sensor exceeds the threshold temperature.

In Example 2, the subject matter of Example 1 can optionally include logic to receive write data from a host device, determine a physical memory address for the write data, read data from memory cells in the physical memory address, compare the data read from the physical memory address to the write data, and write data only to the data cells that are modified by the write data.

In Example 3, the subject matter of any one of Examples 1-2 can optionally include comprises logic, at least partially including hardware logic to perform a bitwise XOR of the read data from memory cells in the physical address with the write data.

In Example 4, the subject matter of any one of Examples 1-3 can optionally include logic to receive write data from a host device, determine a physical memory address for the write data, and write the data to the physical memory address.

In Example 5, the subject matter of any one of Examples 1-4 can optionally include logic to reduce a write current as the output of the temperature sensor increases above the threshold.

In Example 6, the subject matter of any one of Examples 1-5 can optionally include logic to reduce a write pulse duration as the output of the temperature sensor increases above the threshold.

Example 7 is an electronic device, comprising a processor, at least one spin-transfer torque (STT) memory device, and a controller comprising logic, at least partially including hardware logic, to monitor an output of the temperature sensor, implement a first write operation protocol when the output of the temperature sensor fails to exceed a threshold temperature, and implement a second write operation protocol when the output of the temperature sensor exceeds the threshold temperature.

In Example 8 the subject matter of Example 7 can optionally include logic to receive write data from a host device, determine a physical memory address for the write data, read data from memory cells in the physical memory address, compare the data read from the physical memory address to the write data, and write data only to the data cells that are modified by the write data.

In Example 9, the subject matter of any one of Examples 7-8 can optionally include comprises logic, at least partially including hardware logic to perform a bitwise XOR of the read data from memory cells in the physical address with the write data.

In Example 10, the subject matter of any one of Examples 7-9 can optionally include logic to receive write data from a host device, determine a physical memory address for the write data, and write the data to the physical memory address.

In Example 11, the subject matter of any one of Examples 7-10 can optionally include logic to reduce a write current as the output of the temperature sensor increases above the threshold.

In Example 12, the subject matter of any one of Examples 7-11 can optionally include logic to reduce a write pulse duration as the output of the temperature sensor increases above the threshold.

Example 13 is a controller comprising logic, at least partially including hardware logic, to monitor an output of the temperature sensor, implement a first write operation protocol when the output of the temperature sensor fails to exceed a threshold temperature, and implement a second write operation protocol when the output of the temperature sensor exceeds the threshold temperature.

In Example 14 the subject matter of Example 13 can optionally include logic to receive write data from a host device, determine a physical memory address for the write data, read data from memory cells in the physical memory address, compare the data read from the physical memory address to the write data, and write data only to the data cells that are modified by the write data.

In Example 15, the subject matter of any one of Examples 13-14 can optionally include comprises logic, at least partially including hardware logic to perform a bitwise XOR of the read data from memory cells in the physical address with the write data.

In Example 16, the subject matter of any one of Examples 13-15 can optionally include logic to receive write data from a host device, determine a physical memory address for the write data, and write the data to the physical memory address.

In Example 17, the subject matter of any one of Examples 13-16 can optionally include logic to reduce a write current as the output of the temperature sensor increases above the threshold.

In Example 18, the subject matter of any one of Examples 13-17 can optionally include logic to reduce a write pulse duration as the output of the temperature sensor increases above the threshold.

In various embodiments of the invention, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A memory, comprising:
    at least one spin-transfer torque (STT) memory device;
    a temperature sensor proximate the STT memory device; and
    a controller comprising logic, at least partially including hardware logic, to:
        monitor an output of the temperature sensor;
        receive write data from a host device;
        determine a physical memory address for the write data;
        implement a first write operation protocol when the output of the temperature sensor fails to exceed a threshold temperature, wherein in implementing the first write operation protocol, the controller further comprises logic to:
            read data present in the memory cells of the physical memory address;
            compare the data read from the memory cells to the write data; and
            write the write data only to the memory cells that are modified by the write data; and
        implement a second write operation protocol when the output of the temperature sensor exceeds the threshold temperature, wherein the second write operation protocol writes all of the write data to the physical memory address.

2. The memory of claim 1, wherein the logic to compare the data read from the memory cells comprises logic, at least partially including hardware logic to:
    perform a bitwise XOR of the read data from the memory cells in the physical address with the write data.

3. The memory of claim 1, wherein the controller further comprises logic to:
reduce a write current as the output of the temperature sensor increases above the threshold temperature.

4. The memory of claim 1, wherein the controller further comprises logic to:
reduce a write pulse duration as the output of the temperature sensor increases above the threshold temperature.

5. An electronic device comprising:
a processor;
at least one spin-transfer torque (STT) memory device;
a temperature sensor proximate the STT memory device; and; and
a controller comprising logic, at least partially including hardware logic, to:
monitor an output of the temperature sensor;
receive write data from a host device;
determine a physical memory address for the write data;
implement a first write operation protocol when the output of the temperature sensor fails to exceed a threshold temperature, wherein the first write operation protocol, the controller further comprises logic to:
read data present in the memory cells of the physical memory address;
compare the data read from the memory cells to the write data; and
write the write data only to the memory cells that are modified by the write data; and
implement a second write operation protocol when the output of the temperature sensor exceeds the threshold temperature, wherein the second write operation protocol writes all of the write data to the physical memory address.

6. The electronic device of claim 5, wherein the logic to compare the data read from the memory cells comprises logic, at least partially including hardware logic to:
perform a bitwise XOR of the read data from the memory cells in the physical address with the write data.

7. The electronic device of claim 5, wherein the controller further comprises logic to:
reduce a write current as the output of the temperature sensor increases above the threshold temperature.

8. The electronic device of claim 5, wherein the controller further comprises logic to:
reduce a write pulse duration as the output of the temperature sensor increases above the threshold temperature.

9. A controller comprising logic, at least partially including hardware logic, to:
monitor an output of a temperature sensor coupled to at least one spin-transfer torque (STT) memory device;
receive write data from a host device;
determine a physical memory address for the write data;
implement a first write operation protocol when the output of the temperature sensor fails to exceed a threshold temperature, wherein in implementing the first write operation protocol, the controller further comprise logic to:
read data present in the memory cells of the physical memory address;
compare the data read from the memory cells to the write data; and
write the write data only to the memory cells that are modified by the write data; and
implement a second write operation protocol when the output of the temperature sensor exceeds the threshold temperature, wherein the second write operation protocol writes all of the write data to the physical memory address.

10. The controller of claim 9, wherein the logic to compare the data read from the memory cells comprises logic, at least partially including hardware logic to:
perform a bitwise XOR of the read data from the memory cells in the physical address with the write data.

11. The controller of claim 9, wherein the controller further comprises logic to:
reduce a write current as the output of the temperature sensor increases above the threshold temperature.

12. The controller of claim 9, wherein the controller further comprises logic to:
reduce a write pulse duration as the output of the temperature sensor increases above the threshold temperature.

* * * * *